United States Patent
Ichiki et al.

(10) Patent No.: US 7,376,880 B2
(45) Date of Patent: May 20, 2008

(54) TRANSMISSION APPARATUS, TRANSMISSION CONTROL PROGRAM, AND TRANSMISSION METHOD

(75) Inventors: Atsushi Ichiki, Kawasaki (JP); Akira Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 547 days.

(21) Appl. No.: 10/949,337

(22) Filed: Sep. 27, 2004

(65) Prior Publication Data

US 2005/0154965 A1 Jul. 14, 2005

(30) Foreign Application Priority Data

Jan. 9, 2004 (JP) .............................. 2004-004453

(51) Int. Cl.
*H03M 13/35* (2006.01)
*H04L 1/16* (2006.01)
(52) U.S. Cl. ..................... 714/751; 714/774; 714/776
(58) Field of Classification Search ................ 714/748, 714/751, 774, 776
See application file for complete search history.

(56) References Cited

U.S. PATENT DOCUMENTS

| | | | | |
|---|---|---|---|---|
| 5,699,369 A | * | 12/1997 | Guha ........................... | 714/774 |
| 5,828,677 A | * | 10/1998 | Sayeed et al. ................ | 714/774 |
| 5,907,563 A | * | 5/1999 | Takeuchi et al. ............. | 714/751 |
| 5,946,320 A | * | 8/1999 | Decker ........................ | 370/428 |
| 6,031,827 A | * | 2/2000 | Rikkinen et al. ............ | 370/330 |
| 6,128,763 A | * | 10/2000 | LoGalbo et al. ............. | 714/774 |
| 6,359,877 B1 | * | 3/2002 | Rathonyi et al. ............ | 370/349 |
| 6,693,892 B1 | * | 2/2004 | Rinne et al. ................. | 370/348 |
| 6,728,918 B1 | * | 4/2004 | Ikeda et al. .................. | 714/748 |
| 6,778,522 B1 | * | 8/2004 | Rossi et al. .................. | 370/349 |
| 6,865,609 B1 | * | 3/2005 | Gubbi et al. ................. | 709/230 |
| 6,891,799 B1 | * | 5/2005 | Hagai et al. ................. | 370/235 |
| 6,999,432 B2 | * | 2/2006 | Zhang et al. ................ | 370/328 |
| 7,002,923 B2 | * | 2/2006 | Golitschek et al. ......... | 370/253 |
| 7,003,710 B2 | * | 2/2006 | Tomaru et al. .............. | 714/751 |
| 7,016,319 B2 | * | 3/2006 | Baum et al. ................. | 370/329 |
| 7,072,307 B2 | * | 7/2006 | Tong et al. ................... | 370/253 |
| 7,096,028 B2 | * | 8/2006 | Taketsugu ................. | 455/452.2 |
| 7,126,996 B2 | * | 10/2006 | Classon et al. ............. | 375/260 |
| 7,155,236 B2 | * | 12/2006 | Chen et al. ................. | 455/454 |
| 2002/0003783 A1 | * | 1/2002 | Niemela et al. ............ | 370/329 |
| 2003/0076783 A1 | * | 4/2003 | Das et al. ................... | 370/236 |

(Continued)

FOREIGN PATENT DOCUMENTS

JP 07-017175 3/1995

(Continued)

*Primary Examiner*—Stephen M. Baker
(74) *Attorney, Agent, or Firm*—Staas & Halsey LLP

(57) ABSTRACT

A transmission apparatus includes a communication unit for performing transmission and reception of encoded data packets with other terminals, a redundant code generating unit for generating a redundant code packet for restoring data lost due to the loss of a data packet, a redundant code control unit for controlling the band used by the redundant code packet, a buffer for accumulating retransmission packets that can be retransmitted when corresponding data are lost, a retrieval unit for retrieving a corresponding retransmission packet from the buffer for retransmission upon receiving a retransmission request for the data packet, a retransmission control unit for controlling the band used for retransmission, and a band control unit for controlling the bandwidth of a redundant code based on the band used for retransmission and the band currently used for the redundant code.

19 Claims, 9 Drawing Sheets

U.S. PATENT DOCUMENTS

2005/0207345 A1* 9/2005 Onggosanusi et al. ...... 370/236
2006/0007884 A1* 1/2006 Tanaka et al. .............. 370/328

FOREIGN PATENT DOCUMENTS

| JP | 09-214474 | 8/1997 |
| JP | 09-298526 | 11/1997 |
| JP | 2000-228676 | 8/2000 |
| JP | 2002-330118 | 11/2002 |

* cited by examiner

TRANSMISSION APPARATUS, TRANSMISSION CONTROL PROGRAM, AND TRANSMISSION METHOD

BACKGROUND OF THE INVENTION

The invention relates to a method and apparatus for transmitting encoded media data.

Conventionally, in a best-effort transmission line environment such as the Internet, a large volume of encoded packet data (media data) such as streaming information or video telephony is transmitted continuously.

In the best-effort transmission line environment as described above, congestion occurs due to an increase in communication traffic in the network. Quality of media data being transmitted deteriorates noticeably due to this congestion. Techniques for preventing such deterioration in quality of media data include techniques as described below.

One technique, for example, is to use a redundant code such as a Forward Error Correction (FEC) code. Another technique is to use retransmissions such as in an Automatic Repeat Request (ARQ) protocol.

In a FEC system, parity information of the media data is generated and sent from a transmission side, whereby, even in the case where a packet loss occurs on a reception side, it becomes possible to perform restoration of the data of the lost packet.

In an ARQ system, when a packet loss is detected on the reception side, the reception side requests the transmission side to retransmit the lost packet, and the transmission side retransmits the lost packet, whereby it becomes possible to prevent deterioration in quality of the media data.

Further, in the best-effort transmission line environment, conventionally, the deterioration in the quality of the media data due to the packet loss is prevented by the following techniques: a technique that switches between the FEC system, which is effective for a stationary packet loss, and the ARQ system, which is effective for a burst packet loss; and a technique that uses a combination of the FEC system and the ARQ system (e.g., see Patent documents 1 and 2).

Note that, as other related art to the retransmitted invention, for example, there are techniques disclosed in Patent documents 3 to 5 described below.

[Patent Document 1]
Japanese Patent Application Laid-Open Publication No. 7-67175
[Patent Document 2]
Japanese Patent Application Laid-Open Publication No. 2002-330118
[Patent Document 3]
Japanese Patent Application Laid-Open Publication No. 9-214474
[Patent Document 4]
Japanese Patent Application Laid-Open Publication No. 9-298526
[Patent Document 5]
Japanese Patent Application Laid-Open Publication No. 2000-228676

SUMMARY OF THE INVENTION

However, in those techniques, for example, there are problems as described below.

First, in the technique of switching between the FEC system and the ARQ system, feedback information from the reception side is commonly used. However in the best-effort transmission line environment in which plural terminals are interconnected, it is difficult to estimate communication traffic between other terminals. Therefore, the above techniques may not be able to cope with congestion that occurs suddenly.

In addition, in the case where the FEC system and the ARQ system are combined, there is a problem in that transmission increases due to retransmission, which adversely affects other communication traffic. In particular, when congestion occurs, the packet loss occurs in a burst-like manner. Thus, when retransmission is performed in this state, transmission increases significantly. As a result, the state of a transmission line is further deteriorated. Therefore, with this technique, a retransmitted packet may be lost and the recovery effect of the ARQ may consequently not be exhibited.

The present invention has been devised in view of the problems described above. It is a primary object of the invention to provide a technique of compensating for packet loss efficiently. In addition, it is a secondary object of the invention to provide a technique for controlling transmission line congestion caused by retransmitting data.

To solve the above-mentioned problems, the present invention adopts the form of a transmission apparatus including: a communication unit for performing transmission and reception of encoded data packets with other terminals, a redundant code generating unit for generating a redundant code associated with the data packet for restoring data lost due to the loss of the data packet; a redundant code control unit for controlling the band used for the redundant code packet; a buffer for accumulating retransmission packets that can be retransmitted when corresponding data packets are lost; a retrieval unit for retrieving a corresponding retransmission packet from the buffer for retransmission upon receiving a retransmission request for the data packet; a retransmission control unit for controlling the band used for retransmission; and a band control unit for controlling the bandwidth of a redundant code based on the band used for retransmission and the band currently used for the redundant code.

In the present invention, in order to compensate for data lost at the time of transmission of an encoded data packet, the transmission apparatus performs control to keep the sum of the band used for retransmission and the band used for the redundant code at a constant amount.

Therefore, according to the present invention, it is possible to provide a technique for, in the event that a packet loss has occurred on a transmission line, compensating for the loss efficiently.

Further, according to the present invention, the band control unit may instruct the redundant code control unit to reduce the bandwidth of the redundant code based on the band used for retransmission.

Further, according to the present invention, after reducing the bandwidth of redundant codes based on the band used for retransmission, the band control unit may instruct the redundant code control unit to increase the bandwidth.

In this way, in the present invention, an amount of information to be associated with a data packet can be controlled according to a condition in a transmission line, whereby bands in the transmission line can be used effectively.

In addition, in the present invention, the redundant code generating unit generates a redundant code packet, and the band control unit may control the bandwidth of the redundant code by controlling an insertion interval of the redundant code packet at the time of retransmission of the data packet.

Further, according to the present invention, the band control unit may set a threshold value for each or both of the band used for retransmission of the data packet and the band used for the redundant code, and when the band used for retransmission and the band used for the redundant code exceed the threshold value, the band control unit may stop the retransmission of the data packet and the generation of the redundant code.

In this way, according to the present invention, it is possible to provide a technique for controlling congestion in a transmission line that is caused by retransmitting data compensating for a lost packet.

Further, the present invention may be specified as a transmission apparatus comprising: a communication unit for performing transmission and reception of encoded data packets with other terminals; a redundant code generating unit for generating a redundant code for restoring data lost due to a loss of a data packet; a redundant code control unit for controlling a band used for transmission of the redundant code; a buffer for accumulating retransmission packets that can be retransmitted to the other terminals; a retrieval unit for retrieving a corresponding retransmission packet from the buffer for retransmission when receiving a retransmission request for the data packet from another terminal; a retransmission control unit controlling a band used for retransmission; and a band control unit controlling a transmission ratio of the redundant code based on the band used for retransmission and the band currently used for transmission of the redundant code.

Note that the present invention may be implemented as a program realizing any one of the functions described above. In addition, such a program may be recorded in a computer readable storage medium. Further, the invention may be implemented as a method of realizing any one of the functions described above.

According to the invention as described above, an excellent technique for, in the event that a loss has occurred with respect to a packet sent into a transmission line, compensating for the loss efficiently is provided. In addition, the present invention can also provide a technique for controlling transmission line congestion caused by retransmitting data compensating for a packet.

DETAILED DESCRIPTION OF THE INVENTION

A best mode for carrying out the invention will be hereinafter explained with reference to the drawings.

Constitutions of embodiments to be described below are examples, and the invention is not limited to the constitutions of the embodiments.

<Apparatus Structure of a Transmission Apparatus>

A functional structure of a transmission apparatus of the invention will be explained with reference to the drawings.

Figure 1:
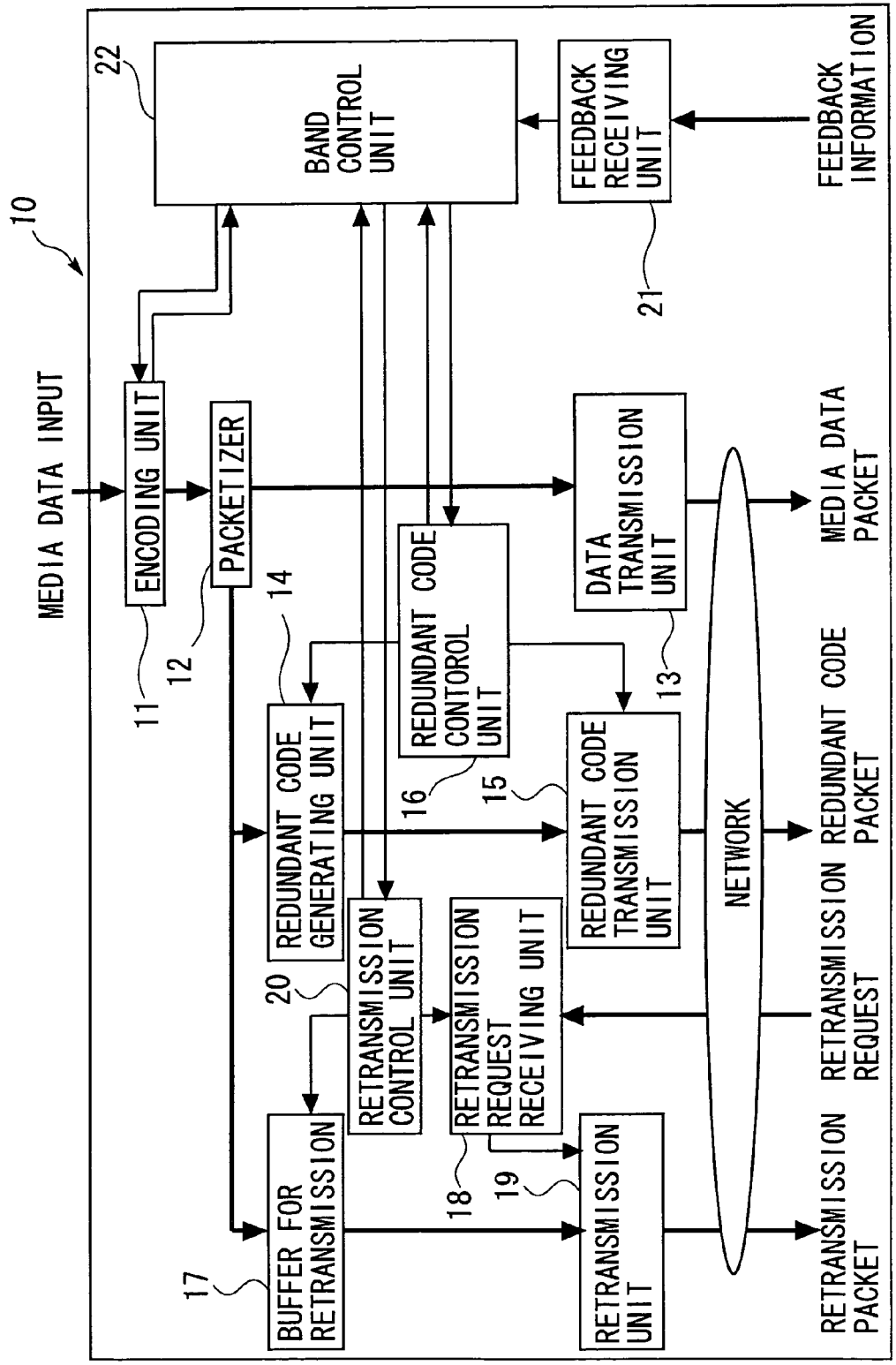
FIG. 1 is a block diagram showing functions of a transmission apparatus in accordance with an embodiment of the invention.

FIG. 1 is a block diagram illustrating a functional structure of the transmission apparatus of the invention. A transmission apparatus 10 of the invention encodes data such as inputted streaming information (hereinafter also referred to as media data). Thereafter, the transmission apparatus 10 packetizes the encoded media data. Then, the transmission apparatus 10 transmits the packetized media data (packet data) into a network. This transmitted packet data is received by a terminal desiring to obtain this data. In addition, in the even that a loss has occurred in the sent media data, the transmission apparatus 10 retransmits the media data in response to a request from a reception side. Moreover, the transmission apparatus 10 transmits redundant code data for restoring data lost due to a packet loss without using retransmission. Note that the transmission apparatus 10 in accordance with this embodiment is realized by various computers in which a transmission control program causing a computer to execute a transmission method of the invention is installed.

The transmission apparatus 10 in accordance with this embodiment includes an encoding unit 11, a packetizer 12, a data transmission unit 13 (equivalent to a communication unit of the invention), a redundant code generating unit 14, a redundant code transmission unit 15 (equivalent to the communication unit of the invention), a redundant code control unit 16, a buffer for retransmission 17, a retransmission request receiving unit 18 (equivalent to the communication unit of the invention), a retransmission unit 19 (equivalent to the communication unit of the invention), a retransmission control unit 20, a feedback receiving unit 21 (equivalent to the communication unit of the invention) and a band control unit 22.

The encoding unit 11 encodes the media data. The packetizer 12 packetizes the media data encoded by the encoding unit 11. The data transmission unit 13 transmits the media data packetized by the packetizer 12 to a client.

The redundant code generating unit 14 generates a redundant code packet that is used in the event that a loss has occurred in the sent media data. The redundant code transmission unit 15 transmits the redundant code packet generated by the redundant code generating unit 14 to the client.

The redundant code control unit 16 controls a band that is used by redundant codes to be sent. The buffer for retransmission 17 accumulates packets of media data for retransmission. The retransmission request receiving unit 18 receives a retransmission request for the data packet from a client (reception side) terminal.

The retransmission control unit 20 receives the retransmission request for the data packet from the client terminal, retrieves a corresponding retransmission packet from the buffer for retransmission 17, and transmits the retransmission packet to the retransmission unit 19. The retransmission unit 19 transmits this retransmission packet to client. In addition, the retransmission control unit 20 controls a band used by the retransmission packet.

The feedback receiving unit 21 receives feedback information such as a packet loss ratio from the client terminal. The band control unit 22 determines transmission bands for all data to be sent including media data, retransmission packets, and redundant code data from the feedback information received by the feedback receiving unit 21. The band control unit 22 controls (manages) the transmission band of all the data to be sent.

With the functions described above, in the case where a redundant code system and a retransmission system are combined in compensating for a loss that occurs at the time of transmission of the encoded data, the transmission apparatus 10 keeps the sum of the band used by retransmission packets and the band used by redundant codes at a constant amount.

Figure 2:
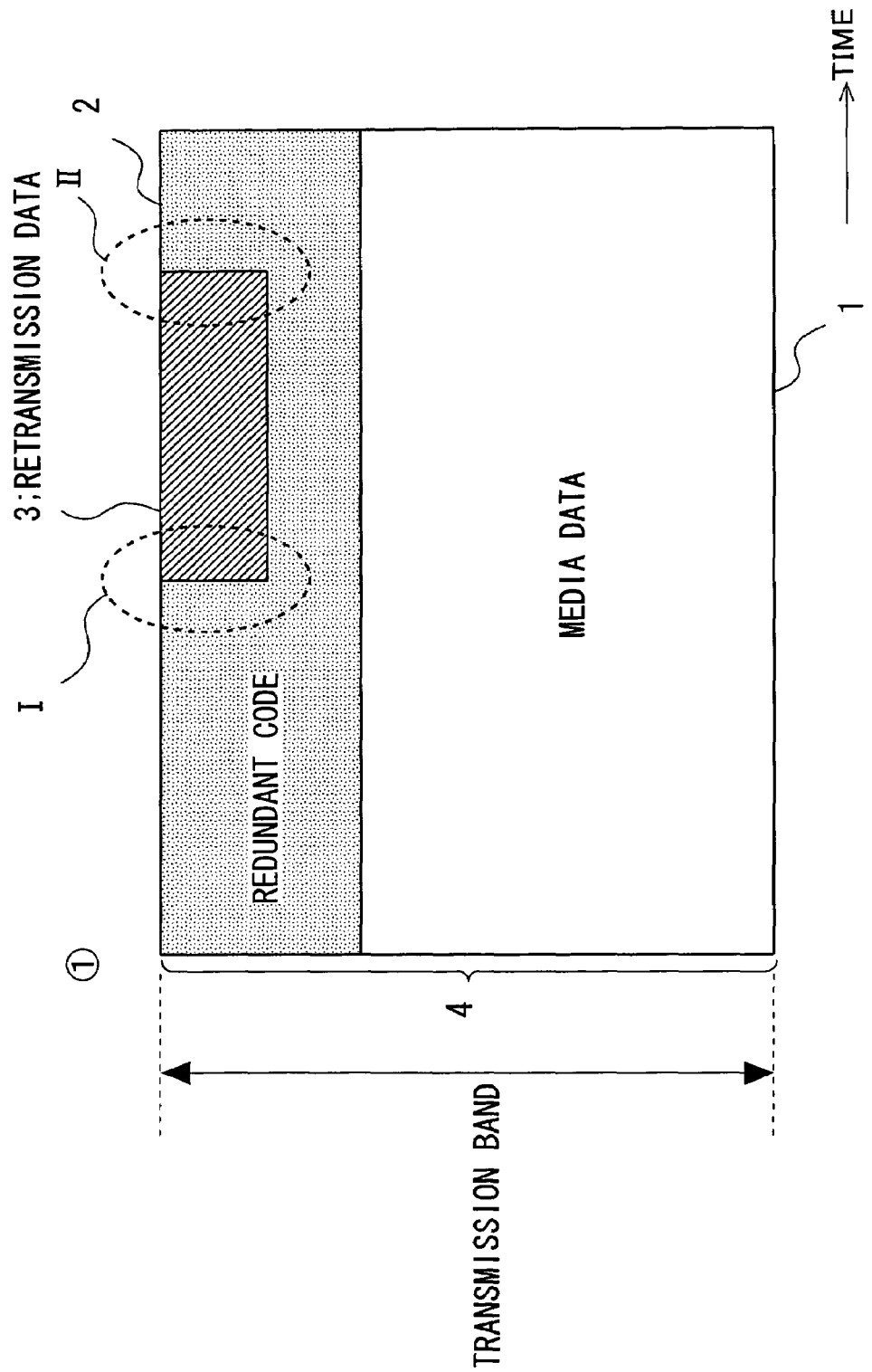
FIG. 2 is a diagram showing an example of processing for keeping the sum of a band used by a retransmission packet and a band used by redundant codes at a fixed amount with the transmission apparatus.

FIG. 2 shows an example of processing for keeping the sum of a band used by retransmission packets and a band used by redundant codes at a constant amount with the transmission apparatus 10. FIG. 2 shows a change of a ratio between redundant code data 2 and retransmission data 3 in an entire transmission band 4 for data including media data 1. Accordingly, when the transmission apparatus 10 transmits the retransmission data 3 with respect to a loss of the media data 1 (a position of I in FIG. 2), the transmission apparatus 10 reduces an attachment ratio of the redundant codes 2. With this processing, the transmission apparatus 10 can transmit the redundant code data 2 and the retransmission data 3, which compensate for media data packet loss, while maintaining the bandwidth of the entire transmission band 4.

In order to perform the processing, the retransmission control unit 20 of the transmission apparatus 10 sequentially notifies the band control unit 22 of bands used for retransmission. The band control unit 22, which has received the band used for retransmission, sequentially instructs the redundant code control unit 16 to reduce the attachment ratio of the redundant code data 2 according to an amount of information in the band used for retransmission. In addition, the transmission apparatus 10 reduces the rate of insertion of redundant code packets (widens an insertion interval of redundant code packets) to thereby reduce the attachment ratio of the redundant code data 2 when retransmission of media data is required.

In addition, with the functions described above, after reducing the attachment ratio of the redundant code data according to a band used for the retransmission of the media data, the transmission apparatus 10 returns the attachment ratio of the redundant code data to an original ratio. In a position of II in FIG. 2, the redundant code data 2, which was reduced to maintain the bandwidth of the entire transmission band including the transmission data 3 in the position of I, is returned to an original bandwidth when the transmission of the retransmission data 3 ends.

In order to realize the processing described above, the band control unit 22 instructs the redundant code control unit 16 to reduce the attachment ratio of the redundant code data 2 according to the band to be used by the retransmission data 3 that are sequentially notified from the retransmission control unit 20. Then, after the transmission of the retransmission data 3, the band control unit 22 instructs the redundant code control unit 16 to return the attachment ratio of the redundant code data 2 to the original ratio. In this case, the transmission apparatus 10 returns the insertion interval of the redundant code packets to the original insertion interval to thereby return the attachment ratio of redundant codes to the original ratio.

In addition, a redundant code to be sent by the transmission apparatus 10 is a redundant code packet to which parity information based on plural packets is attached. Therefore, even if a packet loss has occurred on the Internet, the transmission apparatus 10 is capable of recovering the lost packet using this redundant code packet.

Moreover, with the function described above, in the event that the band used for retransmission of media data and the band used by redundant codes exceed a threshold value, the transmission apparatus 10 stops the retransmission of the media data and the attachment of the redundant codes.

Figure 3:
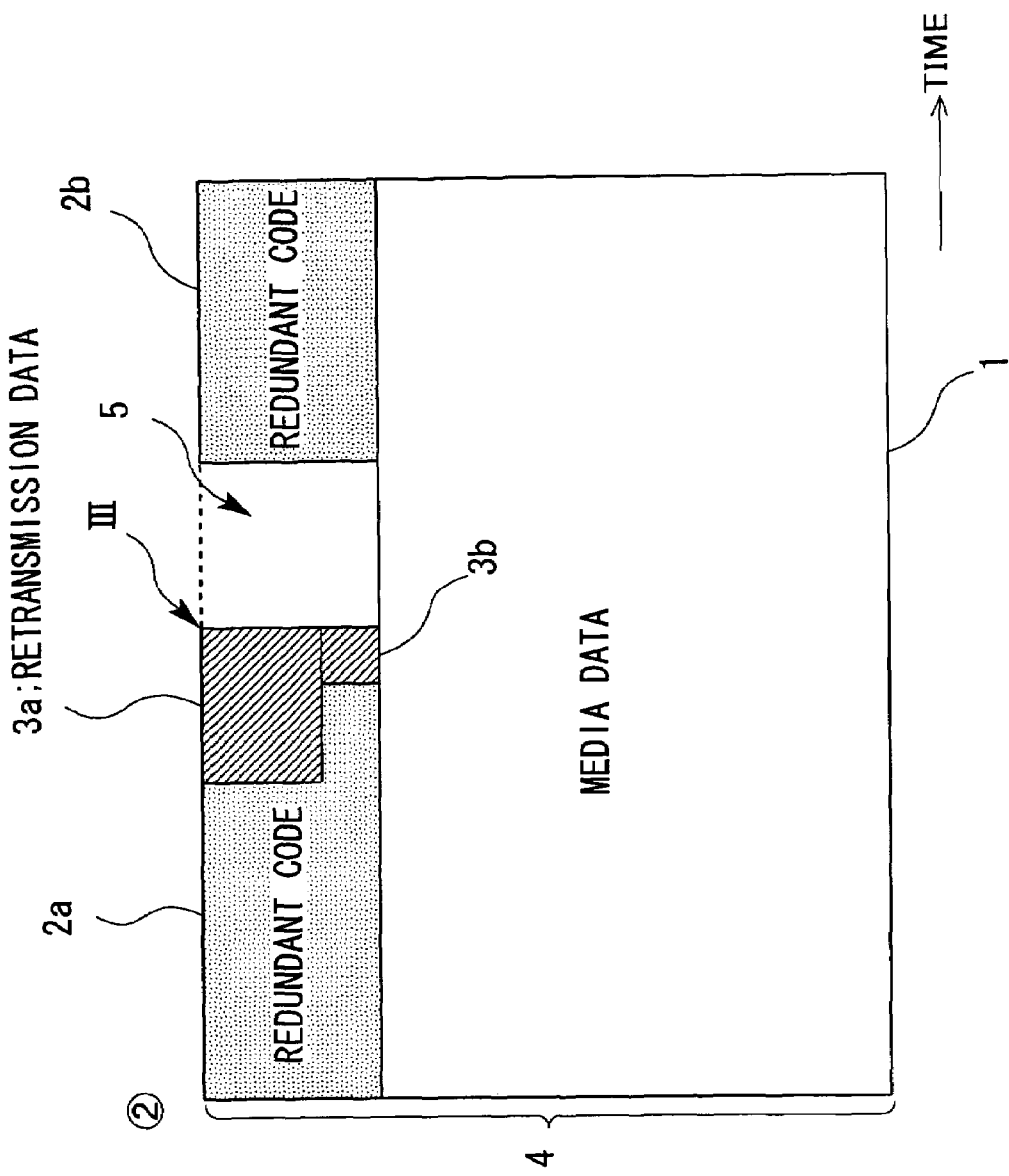
FIG. 3 is a diagram showing an example of the bandwidth of an entire transmission band in the event that bands used by redundant code data and retransmission data exceed a threshold value.

FIG. 3 is an example showing a bandwidth of the entire transmission band 4 in the case where bands used by the redundant code data 2 and the retransmission data 3 have exceeded a threshold value. In FIG. 3, the redundant code data 2 and retransmission data 3a are attached to the entire transmission band 4 together with the media data 1. In this case, in the event that retransmission data 3b is further attached (III in FIG. 3), the band control unit 22 stops attaching the redundant code data 2 and the retransmission data 3a and 3b.

When the band control unit 22 stops the attachment of the redundant code data 2 and the transmission data 3a and 3b, a free band 5 is formed in the entire transmission band. By providing this free band 5, it becomes possible to prevent a situation where a transmission line is further deteriorated by an increase in transmission bands due to retransmission at the time when congestion has occurred. Then, after the condition in the transmission line has improved (IV in FIG. 3), the band control unit 22 resumes the attachment of the redundant code data 2.

<Example of Processing by the Transmission Apparatus>

As an example of processing by the transmission apparatus of this embodiment, a case in which moving picture code data of MPEG-2 (Moving Picture Experts Group phase 2) is transmitted by an RTP (Real-time Transport Protocol) will be explained using the drawings.

In this processing example, a feedback mechanism called an RTCP (RTP Control Protocol) specified by RTP as feedback information is used. Note that, as the RTCP, there are a Sender Report (SR), which is sent from a server to a client every fixed time, and a Receiver Report (RR), which is sent from the client to the server every fixed time.

Figure 4:
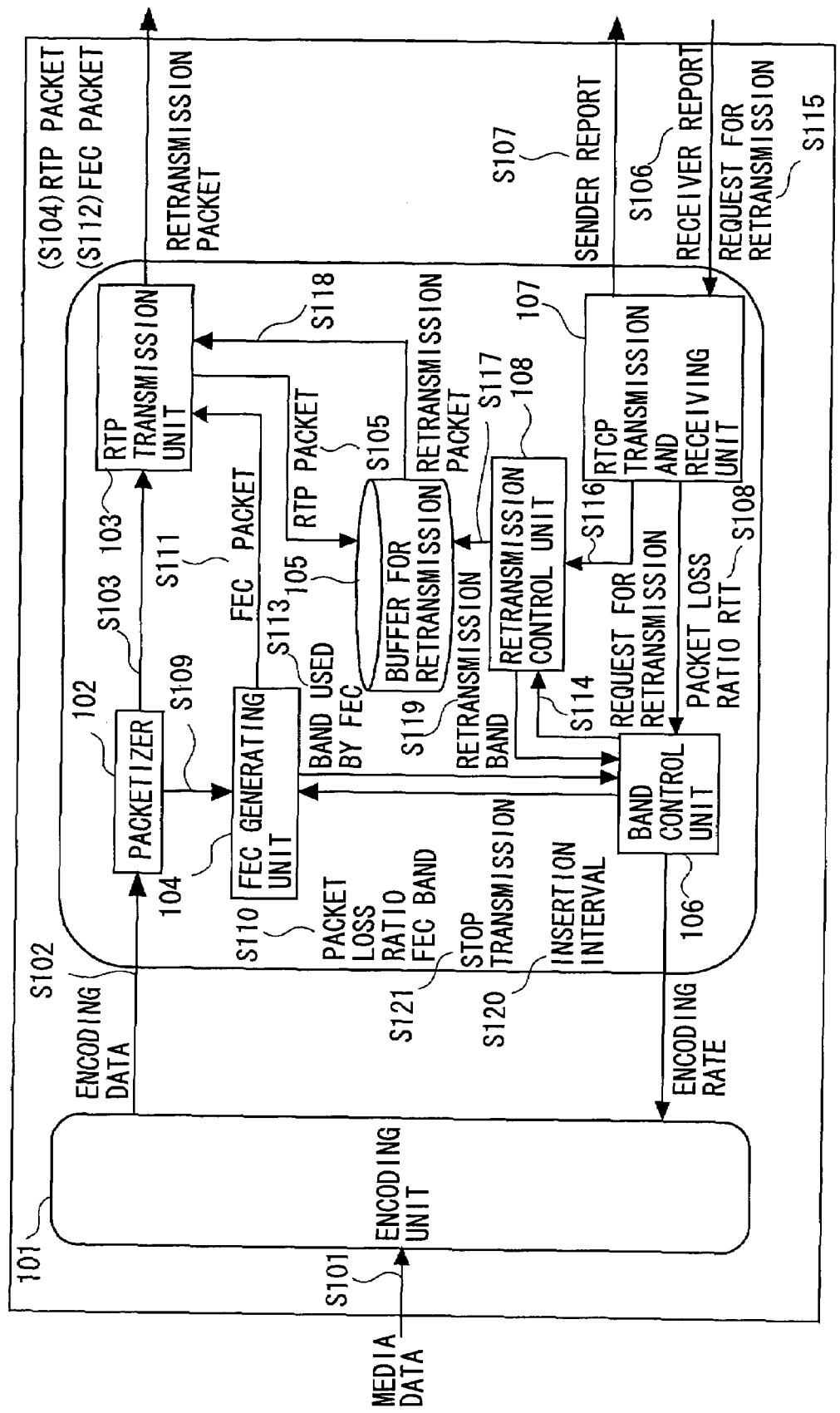
FIG. 4 is a block diagram showing functions of a transmission apparatus in a processing example in accordance with one embodiment.

FIG. 4 is a functional block diagram of a transmission apparatus 100 of this processing example. The transmission apparatus 100 includes a function corresponding to the transmission apparatus 10 explained earlier. The transmission apparatus 100 includes an encoding unit 101 (corresponding to the encoding unit 11), a packetizer 102 (corresponding to the packetizer 12), an RTP sensing unit 103 (corresponding to the data transmission unit 13, the redundant code transmission unit 15, and the retransmission unit 19), an FEC (Forward Error Correction) generating unit 104 (corresponding to the redundant code generating unit 14), a buffer for retransmission 105 (corresponding to the buffer for retransmission 17), a band control unit 106 (corresponding to the band control unit 22), an RTCP transmission and receiving unit 107 (corresponding to the retransmission request receiving unit 18 and the feedback receiving unit 21), and a retransmission control unit 108 (corresponding to the retransmission control unit 20).

<Redundant Code Processing in this Processing Example>

Processing using a redundant code of this processing example will be explained using FIG. 4. The transmission apparatus 100 attaches an FEC packet (redundant code data) in advance to media data that is encoded by the encoding unit 101, and transmits the media data to a client terminal.

The encoding unit 101 applies encoding of MPEG-2 to inputted media data (e.g., moving picture data) (S101). The encoded media data is sent to the packetizer 102 (S102). The packetizer 102 packetizes this media data.

The packetizer 102 transmits the packetized media data to the RTP transmission unit 103 (S103). The RTP transmission unit 103 attaches an RTP header to the media data and transmits the media data to a client through the Internet (S104).

Figure 5:
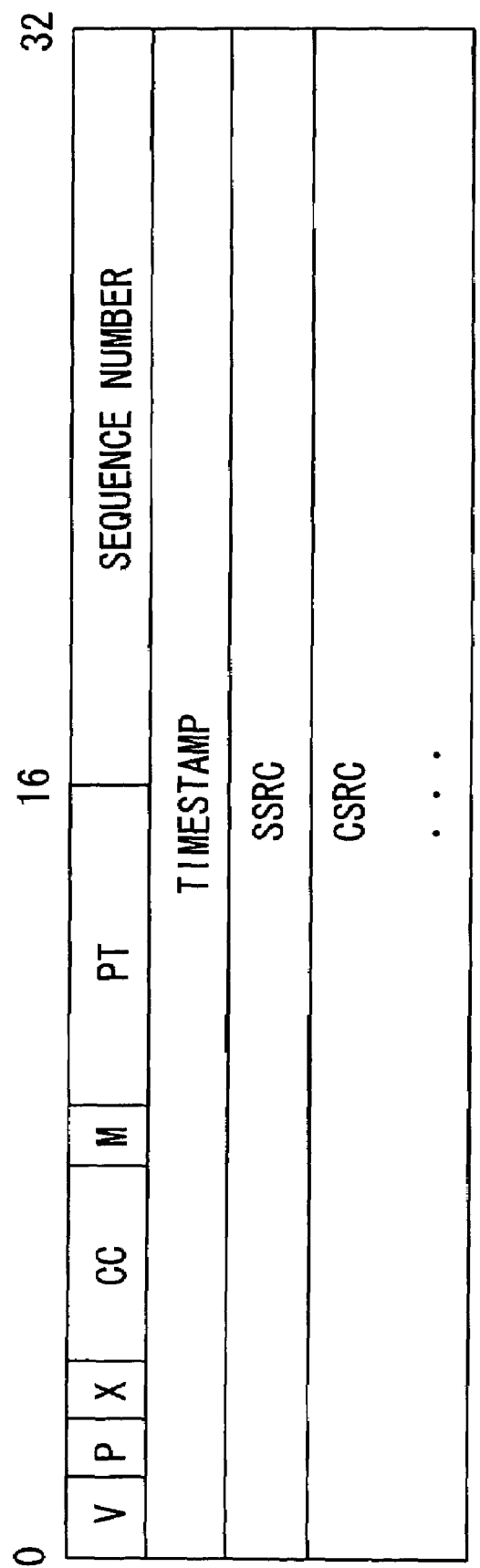
FIG. 5 is an explanatory diagram showing a structure of an RTP header in the processing example.

FIG. 5 is an example of the RTP header to be attached to the media data. The RTP header is constituted by the following information. V (2 bits) indicates a version of the RTP (here, version 2). P (1 bit) indicates the number of bytes padded (attached) to the end of an RTP packet. X (1 bit) indicates whether the RTP header has an extension header just behind the RTP header (here, the extension header is not used). CC (4 bits) indicates the number of CSRCs (contribution source identifier) included in the RTP header. M (1 bit) indicates a marker bit and indicates a boundary of application data. In this processing example, for example, in the case of an MPEG-4 moving picture, M is "1" at the time of the last packet in one frame.

PT (7 bits) is a payload type and indicates an encoding system for the application data. Sequence Number (16 bits) indicates a transmission order of packets. This Sequence Number is used for identifying individual packets. Natural numbers to be given in the transmission order of packets are placed in the field of Sequence Number.

TimeStamp (32 bits) indicates the time at which the first byte of the packet was sent. SSRC (synchronous sender identifier) (32 bits) indicates a sender of the packet. CSRC contribution source identifier) (32 bits) indicates a host that has prepared the packet.

After the media data is sent, a copy of a packet of the media data is stored in the buffer for retransmission 105 as retransmission data (S105).

In addition, the band control unit 106 determines an entire transmission band and a transmission band of FEC using information (S108) sent from the RTCP transmission and receiving unit 107. In this case, as information to be used for the determination, for example, there are a packet loss ratio and jitter included in a Receiver Report (S106), which is sent from the client every fixed time. In addition, as other information to be used for the determination, for example, there are a Sender Report (S107), which is sent from the server side every fixed time, and a round trip time (RTT), which is calculated using the Receiver Report. Note that it is desirable to use an existing determination method as a specific method of determining a transmission band.

When the entire transmission band is determined, the band control unit 106 determines the transmission band of FEC in accordance with information on a packet loss included in the Receiver Report.

As the FEC packet used in this processing example, for example, a packet defined in RFC2733 "An RTP Payload Format for Generic Forward Error Correction" is used. In RFC2733, an FEC packet, for which a parity of the entire packet is calculated, is provided for plural RTP packets. Thus, according to RFC2733, when a packet loss has occurred, a lost packet can be restored using the FEC packet. Note that, in RFC2733, it is recommended to attach at least one FEC packet to twenty-four RTP packets.

The generation of the FEC packet is performed as described below. The packetizer 102 duplicates a generated encoded data packet. The packetizer 102 transmits the duplicated encoded data packet to a buffer for FEC generation (not shown) in the FEC generating unit 104 (S109).

Thereafter, when a predetermined quantity of packets (e.g., twenty-four packets) are accumulated in the buffer for FEC generation, the FEC generating unit 104 generates parity information in accordance with a transmission band of FEC (S110) instructed by the band control unit 106.

Figure 6:
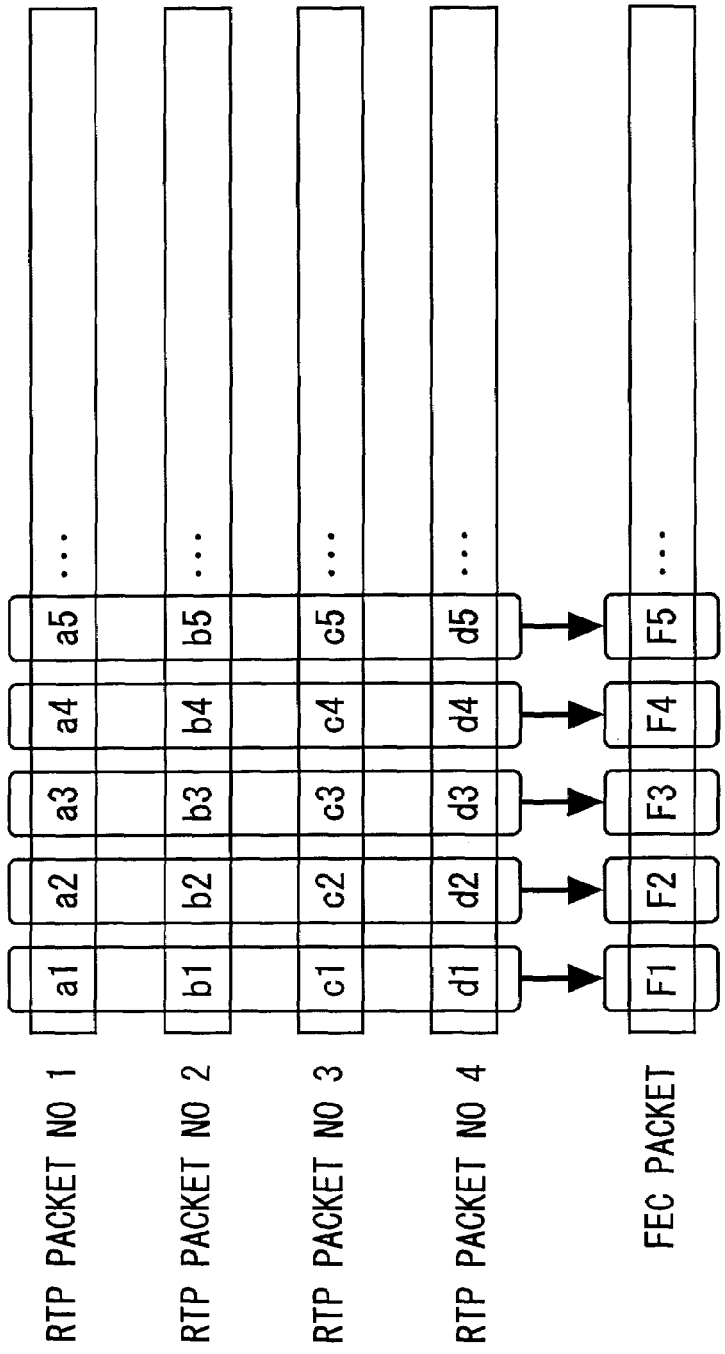
FIG. 6 is a diagram showing a method of generating FEC parity information in the processing example.

FIG. 6 shows an example of processing for generating parity information by the FEC generating unit 104 in this processing example. For example, in the case where the transmission band of FEC is 25%, the FEC generating unit 104 generates six FEC packets for twenty-four RTP packets. In other words, the parity information generated by the FEC generating unit 104 is generated by calculating an exclusive OR by a unit of bit of the respective RTP packets.

Figure 7:
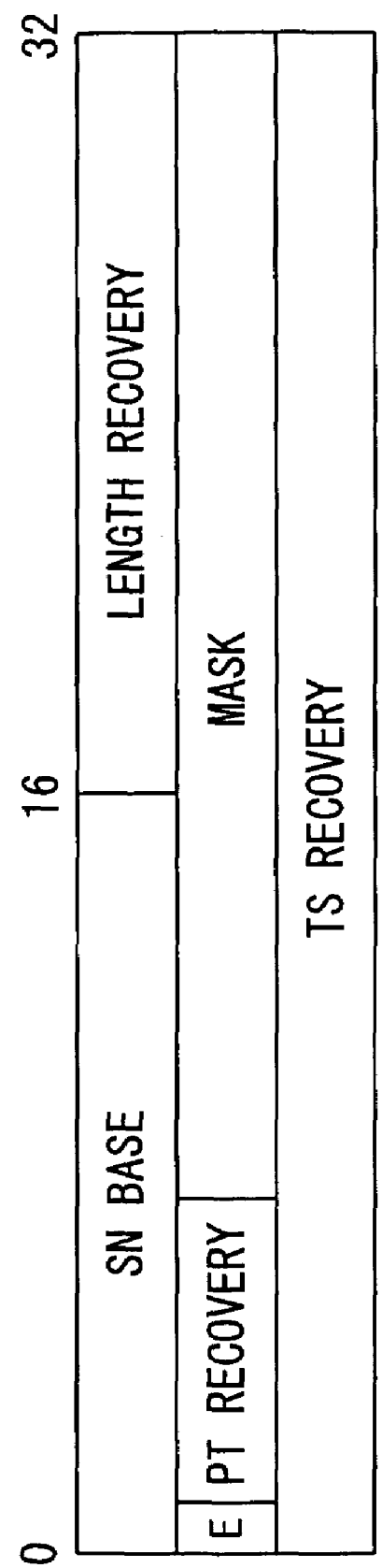
FIG. 7 is a diagram showing a structure of an FEC header in the processing example.

FIG. 7 shows an example of an FEC header generated by the FEC generating unit 104. The FEC header is constituted by the following information. SN Base indicates an offset number of a sequence number of an RTP packet to be the object of FEC processing. Length recovery indicates parity information on a length of the RTP packet. E indicates whether extension of the RTP header is performed (here, E is not set because header extension is not performed). PT recovery indicates parity information on a PT bit. Mask indicates the RTP packet to be the object of the FEC processing. TS recovery indicates parity information on TimeStamp of the RTP packet.

Figure 8:
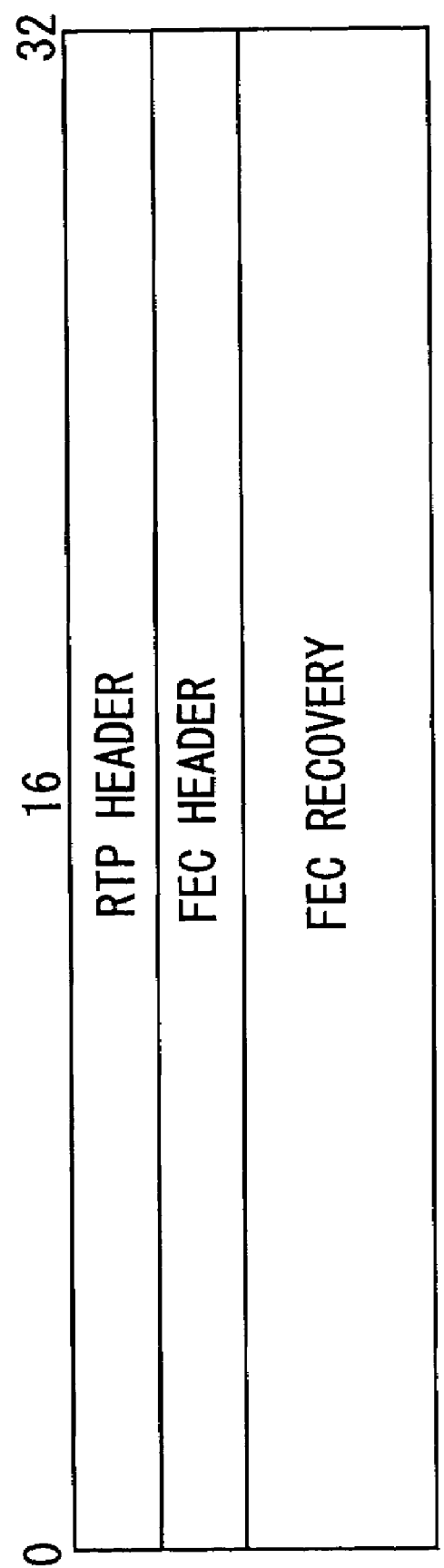
FIG. 8 is a diagram showing a structure of an FEC packet in the processing example.

FIG. 8 shows an example of an FEC packet generated by the FEC generating unit 104. The FEC generating unit 104 generates an FEC packet to which an FEC header and an RTP header are attached. Generated parity information is attached to this FEC packet. Information on FEC (FEC Recovery) is included in the FEC packet other than the RTP header and FEC header information.

The RTP packet to be the object of the FEC processing is defined by the FEC generating unit, for example, as described below. First, it is assumed that an i-th bit in a Mask bit of the twenty-four packets from SN base is "1". In this case, an (SN Base+I)-th packet is the RTP packet to be the object of the FEC processing. The FEC generating unit 104 transmits the FEC packet generated in this way to the RTP transmission unit 103 (S111). In addition, the FEC generating unit 104 notifies the band control unit 106 of a band to be used by the FEC packet (S113). The band control unit 106 controls a band used by retransmission data to be described later according to the band to be used by the FEC packet (S114).

The RTP transmission unit 103 transmits this FEC packet together with the RTP packet (S112).

<Retransmission Processing of this Processing Example>

Next, a flow of processing at the time of retransmission in this processing example will be explained. The RTCP transmission and receiving unit 107 receives a retransmission request packet (S115).

Figure 9:
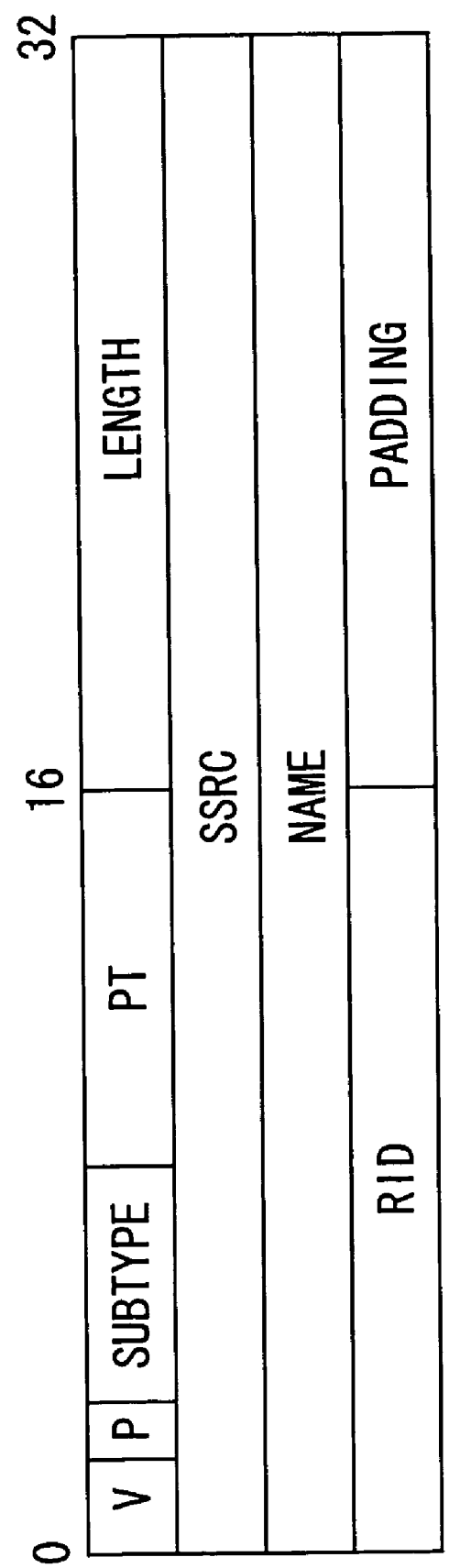
FIG. 9 is a diagram showing a structure of a retransmission request packet in the processing example.

FIG. 9 shows an example of the retransmission request packet in this processing example. For example, the following information is included in the retransmission request packet. V (2 bits) indicates a version of the RTP. Here, V is "2". P (1 bit) is a flag indicating whether the end of a packet is padded. In this processing example, P is "1" because padding is performed. Subtype (5 bits) indicates an arbitrary subtype. In this processing example, Subtype is set to "4"

indicating the retransmission request packet. PT (8 bits) indicates a payload type. Here, PT is set to a fixed value "204" that is determined according to an APP packet of the RTCP. Length (16 bits) indicates a length of the retransmission request packet. SSRC (32 bits) indicates an SSRC (synchronous sender identifier) on the transmission side of the retransmission request packet. NAME (32 bits) is arbitrary ASCII characters uniquely given to this packet peculiarly. Here, NAME is set to "RREQ". A sequence number for identifying a packet of lost media data is placed in RID (16 bits). Padding (16 bits) is "2" because a last octet indicates the number of paddings (octet unit). Therefore, a value of Padding in this processing example is (0×0002).

The RTCP transmission and receiving unit 107, which has received the retransmission request packet, acquires a sequence number of a packet for which retransmission is requested, from the retransmission request packet. Then, the RTCP transmission and receiving unit 107 notifies the retransmission control unit 108 of the acquired sequence number together with a retransmission request (S116).

The retransmission control unit 108 retrieves an RTP packet corresponding to the notified sequence number from the buffer for retransmission 105 (S117). The retransmission control unit 108 transmits the RTP packet with PT in the header replaced to the RTP transmission unit 103 as a retransmission packet (S118).

The retransmission control unit 108 notifies the band control unit 106 of a size of the retransmission packet simultaneously with transmitting the retransmission packet to the RTP transmission unit 103 (S119).

The band control unit 106 has a retransmission counter (not shown) that records the number of times retransmission is performed. The band control unit 106 increments this retransmission counter by one every time retransmission of media data is performed. Then, the band control unit 106 notifies the FEC generating unit 104 to change an insertion interval of the FEC packet based on a value of this retransmission counter (S120).

The notification of an insertion interval of the FEC packet is performed, for example, as described below. When a value of the retransmission counter is larger than 0, the band control unit 106 notifies the FEC generating unit 104 to transmit the FEC packet at the insertion interval twice as large as an initial value. Then, after transmitting the FEC packet at the interval twice as large as the initial value, the band control unit 106 decrements the retransmission counter by one. If the retransmission counter changes to 0 as a result of decrementing a value of the retransmission counter, the band control unit 106 notifies the FEC generating unit 104 to return the insertion interval of the FEC packet to the initial value.

In addition, the band control unit 106 has a threshold value counter (not shown) indicating upper limits of bands to be used by the FEC packet and the retransmission packet. This threshold value counter compares an upper limit value of a bandwidth, which indicates how many bits of the FEC packet and the retransmission packet can be sent per one second, with the current bands. A value of the threshold value counter is reset to the initial value at every predetermined interval (e.g., every one second).

In this processing example, in order not to change the entire transmission band, a band used by the FEC determined by the band control unit 106 is set as an initial value of the threshold value counter.

The band control unit 106 decrements a numerical value corresponding to a transmission size from the threshold value counter every time the FEC packet and the retransmission packet are sent. If the threshold value counter changes to 0 as a result of this decrementing, the band control unit 106 notifies the FEC generating unit 104 and the retransmission control unit 108 to stop the transmission of the FEC packet and the retransmission packet (S121, S114) Upon receiving the notification to stop the transmission, if the retransmission counter is larger than 0, the retransmission control unit 108 resets the value to zero.

After issuing an instruction to stop the transmission or after a predetermined time interval has elapsed, the band control unit 106 resets a value of the threshold value counter (return a value of the threshold value to the initial value). After it is confirmed that the threshold value counter has been reset, the FEC generating unit 104 transmits again the FEC packet with its insertion interval returned to the initial value (S111).

<Effects of this Embodiment>

According to the method and apparatus for transmitting media data in accordance with this embodiment, it is possible to perform error correction for media data efficiently without affecting other communication traffics when congestion has occurred on the best-effort Internet (IP/UDP) or a radio transmission line.

In addition, according to the transmission apparatus and the transmission method in accordance with this embodiment, bands in a transmission line can be utilized effectively.

Further, according to the transmission apparatus and the transmission method in accordance with this embodiment, compensation for media data can be performed effectively while suppressing inconveniences such as congestion caused by data compensating for a loss of transmitted media data.

What is claimed is:

1. A transmission apparatus comprising:
 a communication unit for performing transmission and reception of encoded data packets with other terminals;
 a redundant code generating unit for generating a redundant code associated with a data packet for restoring a loss of the data packet;
 a redundant code control unit for controlling a band used for the redundant code;
 a buffer for accumulating retransmission packets that can be retransmitted to the other terminals;
 a retrieval unit for retrieving a corresponding retransmission packet from the buffer for retransmission after receiving a retransmission request for the data packet from another terminal;
 a retransmission control unit for controlling a band used for retransmission; and
 a band control unit controlling to keep the sum of the band used for retransmission and the band currently used for the redundant code.

2. A transmission apparatus according to claim 1, wherein the band control unit instructs the redundant cede control unit to reduce the bandwidth of the redundant code based on the band used for retransmission.

3. A transmission apparatus according to claim 1, wherein after reducing the bandwidth of the redundant code based on the band used for retransmission, the band control unit instructs the redundant code control unit to increase the bandwidth.

4. A transmission apparatus according to claim 1, wherein the band control unit sets a threshold value for each or both of the band used for retransmission of the data packet and the band used for the redundant code, and when the band used for retransmission and the band used for the redundant code exceed the threshold value, the band control unit stops retransmission of the data packet and generation of the redundant code.

5. A transmission apparatus according to claim 1, wherein the redundant code generating unit generates a redundant code packet, and the redundant code packet carries parity information based on data of plural packets.

6. A transmission apparatus according to claim 5, wherein the band control unit controls the bandwidth of the redundant code by controlling an insertion interval of the redundant code packet at a time of retransmission of the data packet.

7. A computer-readable medium recorded with a transmission control program for causing a computer to execute the steps of:
   performing transmission and reception of encoded data packets with other terminals;
   generating a redundant code associated with a data packet for restoring a loss of the data packet;
   controlling a band used for the redundant code;
   accumulating retransmission packets that can be retransmitted to the other terminals;
   retrieving a corresponding retransmission packet from a buffer for retransmission when a retransmission request for the data packet is received from another terminal;
   controlling a band used for retransmission; and
   controlling to keep the sum of the band used for retransmission and the band currently used for the redundant code.

8. A computer-readable medium recorded with a transmission control program according to claim 7, wherein the transmission control program causes the computer to further execute reducing the bandwidth of the redundant cede based on the band used for retransmission.

9. A computer-readable medium recorded with a transmission control program according to claim 7, wherein the transmission control program causes the computer to further execute increasing the bandwidth, after reducing the bandwidth of the redundant code based on the band used for retransmission.

10. A computer-readable medium recorded with a transmission control program according to claim 7, wherein the transmission control program causes the computer to further execute the steps of:
    setting a threshold value for each or both of the band used for retransmission of the data packet and the band used for the redundant code, and
    stopping, when the band used for retransmission and the band used for the redundant code exceed the threshold value, retransmission of the data packet and generation of the redundant code.

11. A computer-readable medium recorded with a transmission control program according to claim 7, wherein the transmission control program causes the computer to further execute generating a redundant code packet, and the redundant code packet carries parity information based on data of plural packets is associated.

12. A computer-readable medium recorded with a transmission control program according to claim 11, wherein the transmission control program causes the computer to further execute controlling the bandwidth of the redundant code by controlling an insertion interval of the redundant code packet at a time of retransmission of the data packet.

13. A transmission method executed by a computer, the method comprising the steps of:
    performing transmission and reception of encoded data packets with other terminals;
    generating a redundant code associated with a data packet for restoring data lost due to a loss of the data packet;
    controlling a band used for the redundant code;
    accumulating retransmission packets that are to be retransmitted at a time of the loss of the data packet;
    retrieving a corresponding retransmission packet from a buffer for retransmission when a retransmission request for the data packet is received from another terminal;
    controlling a band used for retransmission; and
    controlling to keep the sum of the band used for retransmission and the band currently used for the redundant code.

14. A transmission method according to claim 13, further comprising reducing the bandwidth of the redundant code based on the band used for retransmission.

15. A transmission method according to claim 13, further comprising increasing the bandwidth, after reducing the bandwidth of the redundant code based on the band used for retransmission.

16. A transmission method according to any 13, further comprising:
    setting a threshold value for each or both of the band used for retransmission of the data packet and the band used for the redundant code, and
    stopping, when the band used for retransmission and the band used for the redundant code exceed the threshold value, retransmission of the data packet and generation of the redundant code.

17. A transmission method according to claim 13, further comprising generating a redundant code packet, and wherein the redundant code packet carries parity information based on data of plural packets.

18. A transmission method according to claim 17, further comprising controlling the bandwidth of the redundant code by controlling an insertion interval of the redundant code packet at a time of retransmission of the data packet.

19. A transmission apparatus comprising:
    a communication unit for performing transmission and reception of encoded data packets with other terminals;
    a redundant code generating unit for generating a redundant code for restoring data lost due to a loss of the data packet;
    a redundant code control unit for controlling a band used for transmission of the redundant code;
    a buffer for accumulating retransmission packets that are to be retransmitted to the other terminals after the loss of the data packet;
    a retrieval unit for retrieving a corresponding retransmission packet from the buffer for retransmission when receiving a retransmission request for the data packet from another terminal;
    a retransmission control unit for controlling a band used for retransmission; and
    a band control unit controlling to keep the sum of the band used for retransmission and a band currently used for transmission of the redundant code.

* * * * *

UNITED STATES PATENT AND TRADEMARK OFFICE
CERTIFICATE OF CORRECTION

| | | |
|---|---|---|
| PATENT NO. | : 7,376,880 B2 | Page 1 of 1 |
| APPLICATION NO. | : 10/949337 | |
| DATED | : May 20, 2008 | |
| INVENTOR(S) | : Atsushi Ichiki et al. | |

It is certified that error appears in the above-identified patent and that said Letters Patent is hereby corrected as shown below:

Column 10, Line 55, change "cede" to --code--.

Column 11, Line 33, change "cede" to --code--.

Column 12, Line 24, change "any 13," to --claim 13,--.

Signed and Sealed this

Seventh Day of October, 2008

JON W. DUDAS
*Director of the United States Patent and Trademark Office*